United States Patent
Nam et al.

(10) Patent No.: US 12,125,522 B2
(45) Date of Patent: Oct. 22, 2024

(54) MEMORY DEVICE

(71) Applicant: Samsung Electronics Co., Ltd., Suwon-si (KR)

(72) Inventors: Kyeong Tae Nam, Suwon-si (KR); Young Hun Seo, Seongnam-si (KR); Mi Ji Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 208 days.

(21) Appl. No.: 17/955,978

(22) Filed: Sep. 29, 2022

(65) Prior Publication Data
US 2023/0146659 A1 May 11, 2023

(30) Foreign Application Priority Data

Nov. 8, 2021 (KR) .................. 10-2021-0152457
Apr. 12, 2022 (KR) .................. 10-2022-0045198

(51) Int. Cl.
*G11C 11/40* (2006.01)
*G11C 11/4074* (2006.01)
(Continued)

(52) U.S. Cl.
CPC ...... *G11C 11/4091* (2013.01); *G11C 11/4074* (2013.01); *G11C 11/4094* (2013.01)

(58) Field of Classification Search
CPC ............ G11C 11/4091; G11C 11/4074; G11C 11/4094
See application file for complete search history.

(56) References Cited

U.S. PATENT DOCUMENTS

| | | | |
|---|---|---|---|
| 7,995,405 B2 | 8/2011 | Akiyama et al. | |
| 8,971,142 B2 * | 3/2015 | Jang .................. | G11C 7/065 365/189.11 |

(Continued)

FOREIGN PATENT DOCUMENTS

| | | |
|---|---|---|
| JP | 2002-157885 A | 5/2002 |
| JP | 2010-146689 A | 7/2010 |
| KR | 10-2004-0074837 A | 8/2004 |

OTHER PUBLICATIONS

Hee-Bok Kang et al., "A Sense Amplifier Scheme with Offset Cancellation for Giga-bit DRAM," Journal of Semiconductor Technology and Science, vol. 7, No. 2, 67-75pg, Jun. 2007.

(Continued)

*Primary Examiner* — Han Yang
(74) *Attorney, Agent, or Firm* — Harness, Dickey & Pierce, P.L.C.

(57) ABSTRACT

A memory device is provided. The memory device comprises a memory cell array connected to a first bit line and a complementary bit line, a first bit line sense amplifier configured to sense, amplify and the first bit line signal output a first bit line signal and the complimentary bit signal output on a complementary bit line signal output on the first bit line and the complementary bit line, a charge transfer transistor connected to the first bit line sense amplifier and configured to be gated by a charge transfer signal of a first node, an offset transistor configured to connect the first node and a second node based on an offset removal signal and a pre-charging transistor connected between the second node and a pre-charging voltage line and the pre-charging transistor being configured to pre-charge the first bit line or the complementary bit line based on an equalizing signal.

20 Claims, 14 Drawing Sheets

(51) Int. Cl.
   *G11C 11/4091*   (2006.01)
   *G11C 11/4094*   (2006.01)

(56) References Cited

U.S. PATENT DOCUMENTS

| | | |
|---|---|---|
| 10,950,279 B2 | 3/2021 | Jeong et al. |
| 10,998,030 B2 | 5/2021 | Dietrich et al. |
| 11,120,847 B2 | 9/2021 | Kawamura et al. |
| 2012/0188836 A1* | 7/2012 | Lee .................... G11C 11/4091 |
| | | 365/207 |

OTHER PUBLICATIONS

Masaki Tsukude et al., "A 1.2V to 3.3V Wie Voltage-Range/Low-Power DRAM with a Charge- Transfer Presensing Scheme," Journal of Solid-State Circuits, vol. 32, No. 11, 1721-1727 pg, Nov. 1997.

* cited by examiner

MEMORY DEVICE

CROSS-REFERENCE TO RELATED APPLICATIONS

This application claims priority to Korean Patent Application No. 10-2021-0152457 filed on Nov. 8, 2021 and Korean Patent Application No. 10-2022-0045198 filed on Apr. 12, 2022 in the Korean Intellectual Property Office, and all the benefits accruing therefrom under 35 U.S.C. 119, the contents of which in their entirety are herein incorporated by reference.

BACKGROUND

1. Technical Field

The present disclosure relates to a memory device.

2. Description of the Related Art

A semiconductor memory device is used to store data. Since a random access memory (RAM) is a volatile memory device, it is mainly used as a main memory device of a computer. Dynamic random access memory (DRAM) is a type of RAM that is volatile and made up of memory cells. In order to efficiently sense data stored in memory cells, a bit line and a complementary bit line are pre-charged with a pre-charging voltage, followed by a charge sharing operation, resulting in a difference between a voltage level of the bit line and a voltage level of the complementary bit line. A sense amplifier senses the data stored in memory cells by amplifying the input voltage difference described above, i.e., the voltage difference dVBL between the bit line and the complementary bit line.

Recently, with the development of the electronic industry, the demand for high functionality, high speed, and miniaturization of electronic components has been increasing. Accordingly, in order to improve the integration of a semiconductor memory device, there is a trend to reduce the memory cell region and region of a peripheral circuit for driving the memory cell disposed adjacent to the memory cell region, and to increase a data processing unit to achieve high speed formation of data processing.

The bit line sense amplifier may sense and amplify a voltage variation of the memory cell. In this case, an effective sensing margin of the bit line sense amplifier may be reduced due to bit line coupling noise or bit line sense amplifier offset noise. When a voltage variation is less than or equal to a predetermined (or alternatively, desired) level, the bit line sense amplifier may not sense the voltage variation of the bit line. In other words, the offset noise of the bit line sense amplifier may be a factor that reduces the effective sensing margin.

SUMMARY

One or more example embodiments of the present disclosure provide a memory device for compensating an offset of a bit line sense amplifier.

One or more example embodiments of the present disclosure also provide a memory device with improved operation performance.

One example embodiment of the present disclosure provides a memory device comprising a memory cell array connected to a first bit line and a complementary bit line, a first bit line sense amplifier configured to sense, amplify and output a first bit line signal and a complementary bit line signal, the first bit line signal output on the first bit line and the complimentary bit line signal output line signal output on the complementary bit line, a charge transfer transistor connected to the first bit line sense amplifier and configured to be gated by a charge transfer signal of a first node, an offset transistor configured to connect the first node and a second node based on an offset removal signal and a pre-charging transistor connected between the second node and a pre-charging voltage line and the pre-charging transistor configured to pre-charge the first bit line or the complementary bit line based on an equalizing signal.

Another example embodiment of the present disclosure provides a memory device comprising a memory cell array connected to a sensing bit line and a sensing complementary bit line, a local bit line sense amplifier configured to output a signal output on the sensing bit line to a first bit line and output a complementary signal output on the sensing complementary bit line to a complementary bit line, a first charge transfer transistor connected between the sensing bit line and the first bit line and the first charge transfer transistor configured to be turned on or off based on a charge transfer signal of a first node, and a second charge transfer transistor connected between the sensing complementary bit line and the complementary bit line and the second charge transfer transistor configured to be turned on or off based on the charge transfer signal, wherein the local bit line sense amplifier includes a first equalizing transistor which is connected between a second node and the sensing complementary bit line and gated by a signal of the second node and the local bit line sense amplifier is configured such that a pre-charging voltage is supplied to the second node during an offset removal operation and such that the first node is connected to the second node during the offset removal operation.

Another example embodiment of the present disclosure provides a memory device comprising a memory cell array in a memory bank region of a buffer die and including a plurality of memory cells, a plurality of local bit line sense amplifiers between the memory bank regions and the plurality of local bit line sense amplifiers being connected between the memory cell and a first bit line or between the memory cell and a complementary bit line, a global connection controller in a conjunction region of the buffer die and the global connection controller configured to control an operation of the local bit line sense amplifier and a charge transfer transistor configured to connect a sensing bit line of the local bit line sense amplifier to the first bit line and a sensing complementary bit line of the local bit line sense amplifier to and the complementary bit line, in response to a charge transfer signal supplied via a first node of the global connection controller being applied to a gate of the charge transfer transistor, and wherein the global connection controller connects the first node and a second node while supplying a pre-charging voltage to the second node, a gate of a first equalizing transistor of the local bit line sense amplifier being connected to the second node during an offset removal operation.

The example embodiments of the present disclosure are not restricted to those set forth herein, and other unmentioned technical aspects will be clearly understood by one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached FIGS. 1 to 16, in which.

DETAILED DESCRIPTION OF THE EXAMPLE EMBODIMENTS

Figure 1:
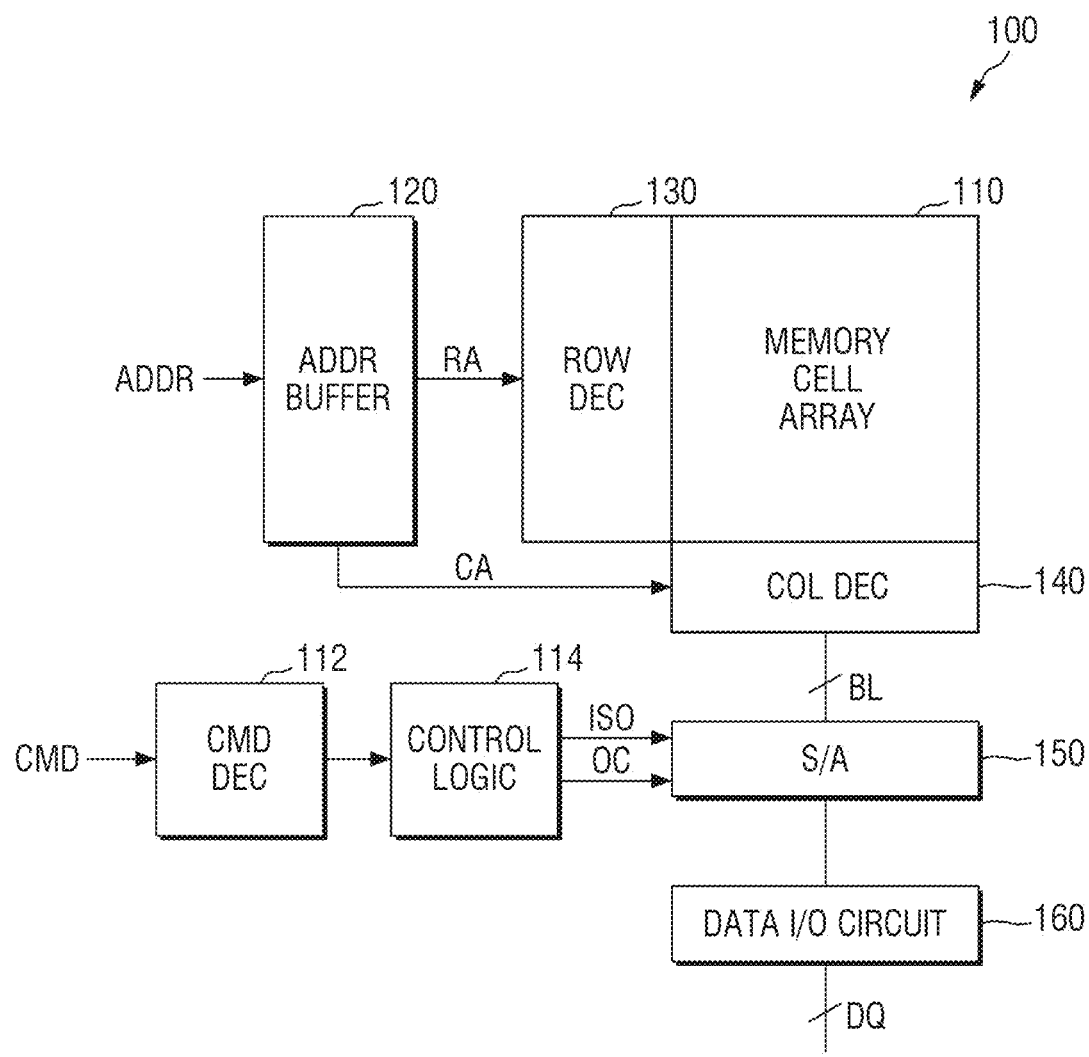
FIG. 1 is a view illustrating explaining a memory device according to some example embodiments.

Hereinafter, various example embodiments of the present disclosure will be described with reference to the attached drawings:

FIG. 1 is a view illustrating explaining a memory device according to some example embodiments.

Referring to FIG. 1, a memory device 100 may be a storage device based on a semiconductor device. For example, the memory device 100 may be dynamic random access memory (DRAM) such as double data rate static DRAM (DDR DRAM), single data rate SDRAM (SDR SDRAM), low power DDR SDRAM (LPDDR SDRAM), low power SDR SDRAM (LPSDR SDRAM) or direct RDRAM (Rambus DRAM), or any other volatile memory device. In particular, the memory device may be a device to which a standard protocol such as DDR4 or DDR5 is applied.

In one example embodiment, the number of data pins to which the DDR4 or DDR5 standard protocol is applied may be four, eight, or sixteen, and the number of data pins of the semiconductor memory device 100 according to the present disclosure may be sixteen. Hereinafter, the description of the number of data pins of a memory system 50 used in the description of the present invention may be applied according to the standard protocol for the dynamic random access memory, but the present disclosure is not limited thereto.

The memory device 100 may output data via data lines DQ in response to a command CMD, an address ADDR, and control signals received from an external device, for example, a memory controller. For example, an external memory controller may transmit a command CM, address ADDR and control signals to the memory device 100 and in response, the memory device 100 may output data on the data lines DQ. The memory device 100 includes a memory cell array 110, a command decoder 112, a control logic 114, an address buffer 120, a row decoder 130, a column decoder 140, a sense amplifier array 150, and a data input/output circuit 160.

The memory cell array 110 includes a plurality of memory cells supplied in the form of a matrix disposed in rows and columns. The memory cell array 110 includes a plurality of word lines and a plurality of bit lines BL connected to memory cells. The plurality of word lines may be connected to rows of the memory cells, and the plurality of bit lines BL may be connected to columns of the memory cells.

According to some example embodiments, the memory cell may include a normal memory cell configured to store data and a redundant memory cell. The redundant memory cell is used to relieve a normal memory cell when the normal memory cell is defective.

The command decoder 112 decodes commands received from the memory controller, for example, a write enable signal (/WE), a low address strobe signal (/RAS), a column address strobe signal (/CAS), and a chip selection signal (/CS). The command CMD may include an active command, a read command, a write command, and a pre-charge command.

In response to the decoded command, the control logic 114 may generate all kinds of control signals necessary (or alternatively, desired) for an access operation for the memory cell array 110, for example, a write operation, a read operation, and a pre-charge operation.

The address buffer 120 receives the address ADDR from the memory controller that is an external device. The address ADDR includes a row address RA for addressing a row of the memory cell array 110 and a column address CA for addressing a column of the memory cell array 110. The address buffer 120 may transmit the row address RA to the row decoder 130 and transmit the column address CA to the column decoder 140.

The row decoder 130 may select any one of the plurality of word lines WL connected to the memory cell array 110. The row decoder 130 may decode the row address RA received from the address buffer 120, select any one of word lines corresponding to the row address RA and activate the selected word line. Upon the activation of a word line, i.e., an operation of enabling the word line, a high-power voltage VPP higher than a power voltage VDD may be applied to a gate of an access transistor of the memory cell. For example, the high-power voltage VPP may be applied to a gate of the access transistor of the memory cell in response to the activation of the word line.

The column decoder 140 may select a desired (or alternatively, predetermined) bit line from the plurality of bit lines BL of the memory cell array 110. The column decoder 140 may decode the column address CA received from the address buffer 120 to select the desired bit line BL corresponding to the column address CA.

The sense amplifier arrays S/A 150 are connected to the bit lines BL of the memory cell array 110. The sense amplifier array 150 senses a voltage change of the bit line selected from the plurality of bit lines BL and amplifies and outputs the voltage change. The data input/output circuit 160 may output data based on the sensed and amplified voltage from the sense amplifier array 150 to the outside via the data lines DQ. Any bit line sense amplifier BLSA may be connected to a bit line pair composed of a first bit line BL and a complementary bit line BLB to sense and amplify a potential represented in the bit line. The detailed connection between the bit line sense amplifier and the bit line pair will be described later in FIGS. 3 and 4.

The sense amplifier array 150 may receive an isolation signal ISO and an offset removal signal OC from the control logic 114. The sense amplifier array 150 may perform an offset removal operation according to the isolation signal ISO and the offset removal signal OC. For example, the offset refers to characteristics such as, for example, a threshold voltage difference, between semiconductor elements constituting the sense amplifier array 150.

Figure 2:
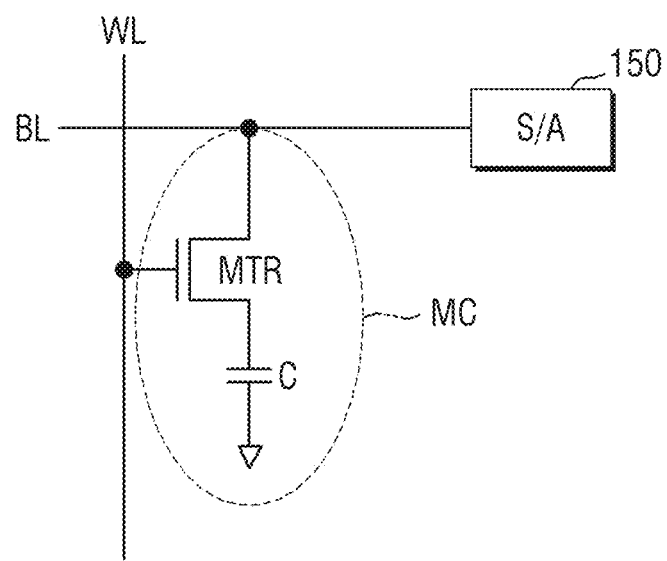
FIG. 2 is a view illustrating the memory cell of FIG. 1.

FIG. 2 is a view illustrating the memory cell of FIG. 1.

Referring to FIGS. 1 and 2, a memory cell MC included in the memory cell array is connected to each of the word lines WL and the bit lines BL.

The memory cell MC is composed of a cell transistor MTR and a cell capacitor C. The memory device 100 may perform a read operation or a refresh operation based on a charge amount of the cell capacitor C included in the memory cell MC. In this case, a first bit line BL connected to the memory cell MC is pre-charged with a pre-charging voltage Vpre. Then, with the activation of the word line WL, the charge sharing operation occurs between a charge of the first bit line BL charged with the pre-charging voltage Vpre and a charge of the cell capacitor C of the memory cell MC. Through the charge sharing operation, a voltage of the first bit line BL may decrease or increase by a voltage variation V from the pre-charging voltage Vpre. Each of the sense amplifiers of the sense amplifier array 150 may sense and amplify the voltage variation V.

Figure 3:
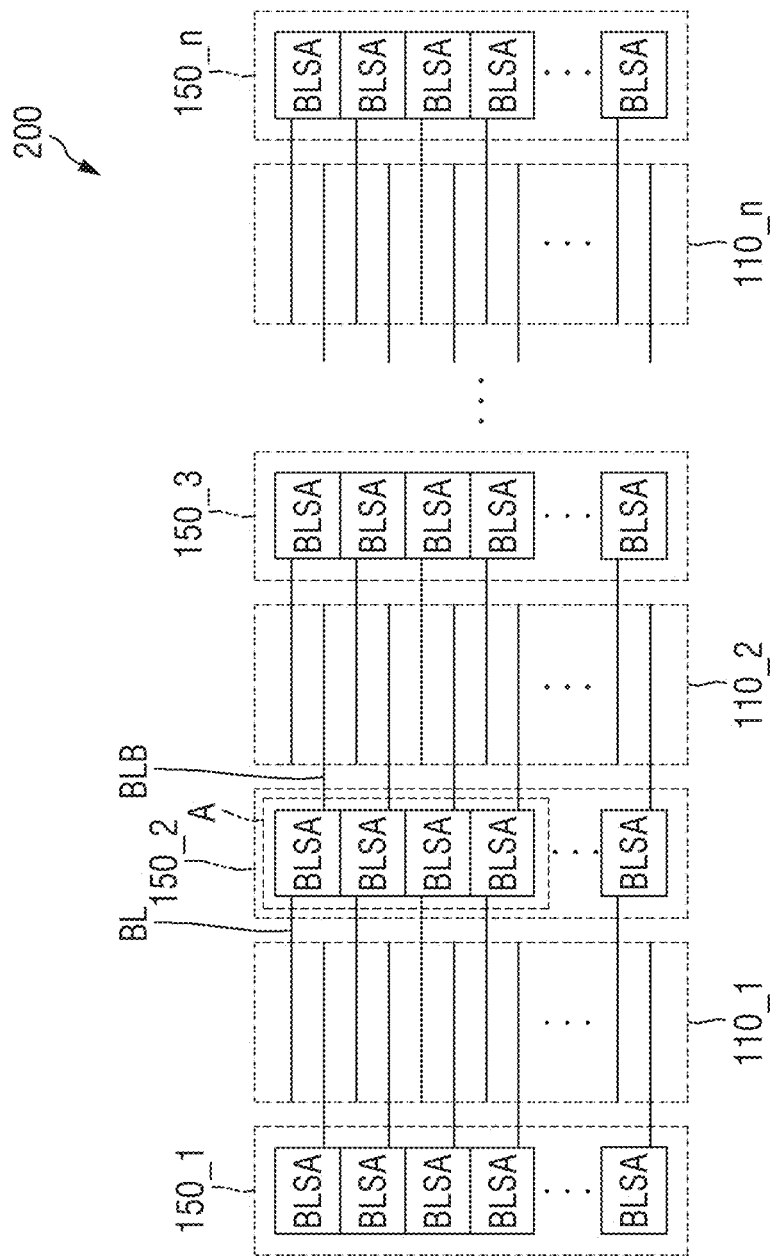
FIG. 3 is a view illustrating a memory cell array to which the sense amplifier according to some example embodiments is applied.

FIG. 3 is a view illustrating a memory cell array to which the sense amplifier according to some example embodiments is applied.

Referring to FIG. 3, the memory device 300 includes a plurality of memory cell arrays 110_1 to 110_n and a plurality of sense amplifiers 150_1 to 150_n.

Each of the plurality of sense amplifiers 150_1 to 150_n may include a plurality of bit line sense amplifiers BLSA. The bit line sense amplifiers BLSA may be implemented with the sense amplifier array 150 described in FIGS. 1 to 2.

A plurality of bit line pairs BL and BLB connected to the plurality of memory cell arrays 110_1 to 110_n may be connected to each of the plurality of bit line sense amplifiers BLSA, respectively. Each of the bit line sense amplifiers BLSA may be cross-coupled differential sense amplifiers implemented as a P-type sense amplifier and an N-type sense amplifier.

Each of the bit line sense amplifiers BLSA is a circuit device that normally operates during operation of the semiconductor memory device, and is distinguished from dummy sense amplifiers 150-1 and 150-n implemented in a region except a region where the bit line sense amplifiers 150_2 to 150_n-1 are implemented.

According to some example embodiments, an odd bit line of the memory cell array 110_1 may be connected to the first bit line BL, and an even bit line thereof may be connected to the complementary bit line BLB. The bit line sense amplifier 150-2 may be connected to each of the bit line pairs BL and BLB in both directions. For example, the bit line sense amplifier 150-2 may be connected to an odd-numbered bit line (e.g., BL1, BL3, BL5, . . . etc.) of the first memory cell array 110_1 on the left, namely, the bit line BL, whereas the bit line sense amplifier 150-2 is an even-numbered bit line (e.g., BL0, BL2, BL4, . . . etc.) of the second memory cell array 110_2 on the right, namely, the complementary bit line BLB.

In the sensing operation of the bit line sense amplifier, when the potential of the bit line BL is a high potential, the potential of the complementary bit line BLB becomes a low potential. Meanwhile, in the sensing operation of the bit line sense amplifier, when the potential of the bit line BL is a low potential, the potential of the complementary bit line BLB becomes a high potential.

Although not illustrated, an odd-numbered bit line of the second memory cell array 110_2 may be connected to the bit line sense amplifier 150-3 by extending in a direction opposite to the bit line sense amplifier 150-2.

Figure 4:
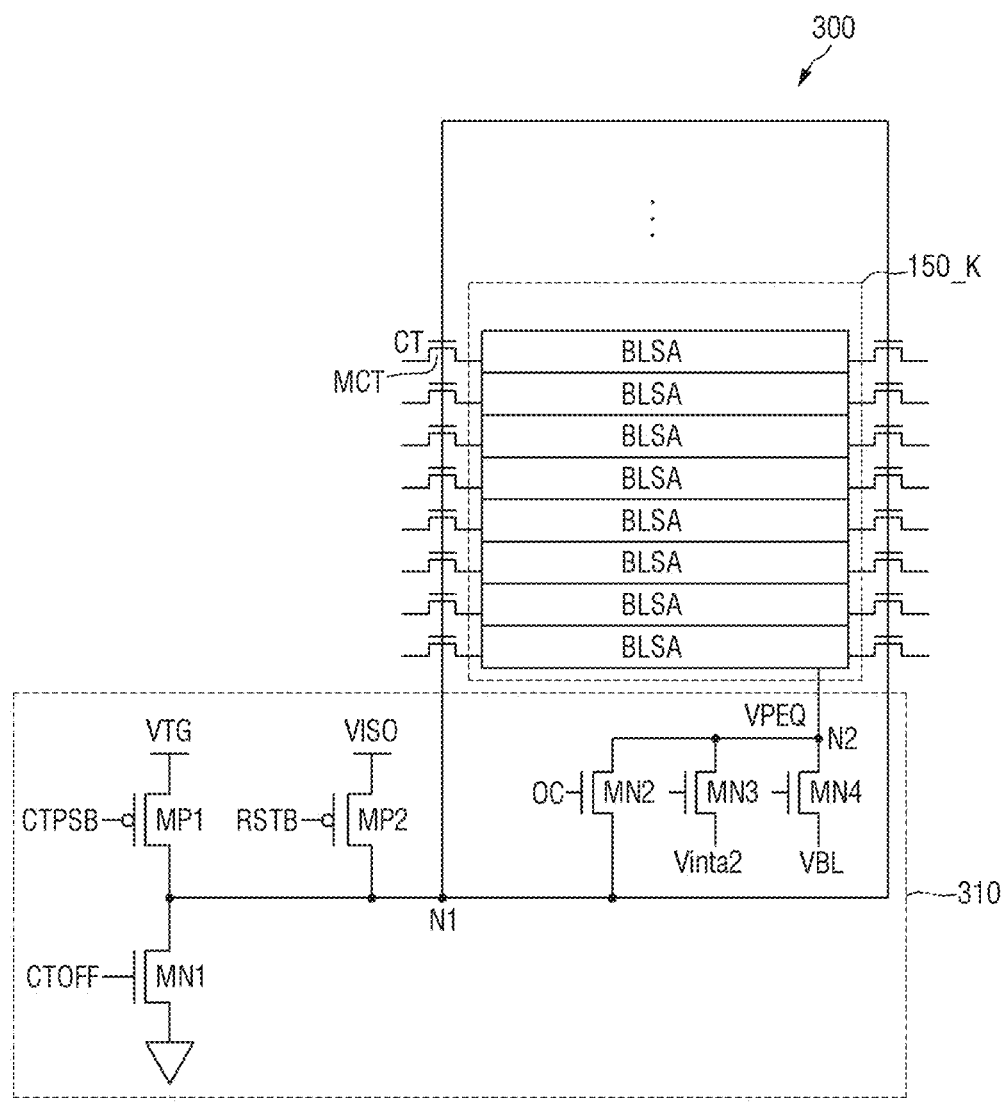
FIG. 4 is a circuit diagram illustrating a bit line sense amplifier according to some example embodiments.

FIG. 4 is a circuit diagram illustrating a bit line sense amplifier according to some example embodiments.

Referring to FIG. 4, according to some example embodiments, the memory device 300 includes a global connection controller 310 and a plurality of local bit line sense amplifiers 150_k. Each of the local bit line sense amplifiers 150 is connected to the global connection controller 310 via a charge transfer transistor MCT. The charge transfer transistor MCT may be turned on according to the charge transfer signal CT (for example, logic high in the case of an N-type transistor), and the charge transfer signal CT may be logic high or logic low according to a voltage of a node N1.

The global connection control unit 310 may include CTPS transistors MP1 and MN1, an isolation transistor MP2, an offset transistor MN2, an internal power supply transistor MN3, and a pre-charging transistor MN4. For convenience of explanation, FIG. 4 illustrates the global connection control unit 310 corresponding to any one column of the charge transfer transistor MCT included in the local bit line sense amplifier 150_k, and according to various example embodiments, the global connection control unit 310 may be implemented to correspond to each column of the local bit line sense amplifier 150_k.

According to some example embodiments, transfer gate transistors MP1 and MP2 are connected in series between a transfer gate voltage VTG line and a ground line by using the node N1 to which the charge transfer signal CT is applied, as a common node, and a charge transfer pre-sensing bar signal CTPSB is applied to a gate of a P-type transfer gate transistor MP1, and a charge transfer off signal CTOFF is applied to a gate of a N-type transfer gate transistor MN1.

The local bit line sense amplifier 150_k is connected to the plurality of bit lines BL and the complementary bit line BLB, respectively, and is connected as a local bit line sense amplifier 150_k. The local bit line sense amplifiers 150_k connect the sensing bit line SBL or the sensing complementary bit line SBL to the bit line BL or the complementary bit line BLB according to the isolation transistor MP2 and charge transfer transistors MCT and MCTB connected to the memory cell. The charge transfer transistors MCT and MCTB may be implemented as N-type transistors according to some example embodiments, and one end of the charge transfer transistors is connected to the sensing bit line/sensing complementary bit line SBL/SBLB of the local bit line sense amplifier 150 and the other end thereof is connected to the bit line/complementary bit line BL/BLB. The charge transfer transistors MCT and MCTB are turned on/off according to the charge transfer signal CT supplied to the gate. For example, in the case of implementing the charge transfer transistor as the N-type transistor, the transistor transfer signal CT may be turned on when the charge transfer signal CT is logic high. In various example embodiments the isolation transistor MP2, the offset transistor MN2, the internal power supply transistor MN3, and the pre charge transistor MN4 (as well as other transistors) may each be implemented as either a P-type or an N-type transistor.

According to some example embodiments, the isolation transistor MP2 is connected between an isolation voltage line VISO and the node N1, and a restore bar signal RSTB is applied to the gate. According to some example embodiments, the isolation transistor MP2 may be implemented as a P-type transistor, and the isolation transistor MP2 is activated and turned on when the restore bar signal RSTB is logic low. According to another example embodiment, in the case of implementing the isolation transistor as the N-type transistor, the transistor may be activated and turned on when the restoration signal RST is logic high.

According to some example embodiments, the offset transistor MN2 is connected between a node N2 and the node N1, and the offset removal signal OC is applied to the gate. According to some example embodiments, the offset transistor MN2 may be implemented as the N-type transistor, and the offset transistor MN2 may be turned on when the offset removal signal OC is logic high. According to some example embodiments, the offset transistor may be implemented as the P-type transistor, and the offset transistor may be turned on when the offset removal signal OC is logic low.

According to some example embodiments, the internal power supply transistor MN3 is connected between an internal power supply line Vinta2 and the node N2, and an internal power enable signal is applied to the gate. The internal power supply transistor MN3 supplies the internal power Vinta2 to the node N2 according to the internal power enable signal. According to some example embodiments, the internal power supply transistor MN3 may be the N-type transistor, but the present disclosure is not limited thereto and the internal power supply transistor MN3 may be implemented as the P-type transistor.

According to some example embodiments, the pre-charge transistor MN4 is connected between the pre-charging voltage VBL line and the node N2, and the equalizing signal EQ is applied to the gate. According to some example embodiments, the pre-charge transistor MN4 may be the N-type transistor, but the present disclosure is not limited thereto and the pre-charge transistor may be implemented as the P-type transistor.

According to the operation of the bit line sense amplifier, the transfer gate voltage VTG is applied to the node N1, a ground voltage GND may be applied to the node N1, the isolation voltage VISO may be applied to the node N1, or the node N1 may be connected to the node N2.

The node N2 may be connected to the node N1 according to the offset removal signal OC, receive a cell data storage voltage Vinta2 according to the memory cell enable signal, or receive an equalizer voltage VBL according to an equalizer enable signal PEQ.

In a memory device of a charge transfer pre-sensing manner, a sensing voltage Vsense of the memory cell is output from the cell transistor MTR and a signal Vcell stored in the sensing bit line SBL is output to a source terminal of the charge transfer transistors MCT and MCTB. Accordingly, the charge transfer transistor MCT may output a value obtained by subtracting a threshold voltage VTH from a gate-source voltage Vgs (Vout=Vgs-VTH). However, with an increase in the integration of the memory devices and a decrease in the size of memory cells, the charge transfer transistor MCT and the charge transfer transistor MCTB may result in a process mismatch. When the threshold voltage (or threshold voltage VTH) is changed due to the mismatch of the charge transfer transistor, the sensing voltage of the memory cell may also produce an error. However, in order to compensate for the threshold voltage offset of the charge transfer transistor caused by the mismatch, the internal power supply voltage Vinta2 is additionally supplied to the node N1 via the internal power supply transistor MN3 during the offset removal operation, thereby strengthening the charge transfer signal CT supplied to the gate of the charge transfer transistor MCT and minimizing or reducing an offset effect of the threshold voltage VTH caused by the mismatch.

Figure 5:
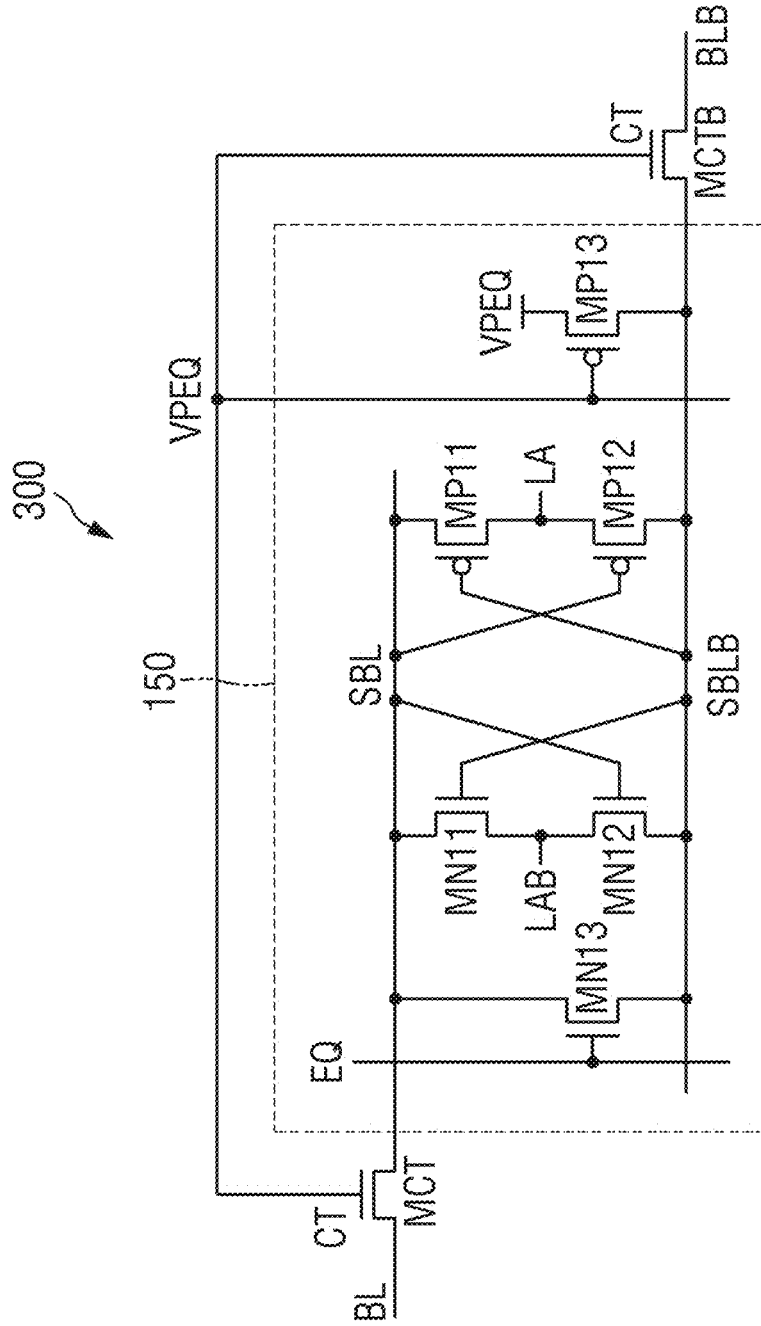
FIG. 5 is a circuit diagram illustrating the local bit line sense amplifier according to some example embodiments.

FIG. 5 is a circuit diagram illustrating the local bit line sense amplifier according to some example embodiments.

Referring to FIGS. 4 and 5, the local bit line sense amplifier t150 is connected between a first control line LA to which a first control signal LA is supplied and a second control line LAB to which a second control signal LAB is supplied, and is connected between the bit line BA and the complementary bit line BLB.

The local bit line sense amplifier 150 includes P-type amplifiers MP11 and MP12 of which one end is connected to the first control line LA, and N-type amplifiers MN11 and MN12 of which one end is connected to the second control line LAB. The other ends of the P-type amplifiers MP11 and MP12 and the N-type amplifiers MN11 and MN12 may each be electrically connected to the sensing bit line SBL or the sensing complementary bit line SBLB to which the bit line BA and the complementary bit line BLB are connected, respectively. An amplification transistor MP11 and an amplification transistor MP12, and an amplification transistor MN11 and an amplification transistor MN12 are connected to each other in a cross-coupling structure.

Specifically, the amplification transistor MP11 is connected between the first control line LA and the sensing bit line SBL, and the gate is connected to the sensing complementary bit line SBLB. The amplification transistor MP12 is connected between the first control line LA and the sensing complementary bit line SBLB, and the gate is connected to the sensing bit line SBL. The amplification transistor MN11 is connected between the second control line LAB and the sensing bit line SBL, and the gate is connected to the sensing complementary bit line SBLB. The amplification transistor MN12 is connected between the second control line LAB and the sensing complementary bit line SBLB, and the gate is connected to the sensing bit line SBL.

According to some example embodiments, the local bit line sense amplifier 150 includes a first equalizing transistor MP13 and a second equalizing transistor MN13. The second equalizing transistor MN13 is connected between the sensing bit line SBL and a node SBLB, and electrically connects the bit line BL and the complementary bit line BLB when a second equalizing signal EQ is applied to the gate (e.g., EQ enable). The first equalizing transistor MP13 is connected to a node N2, namely, a VPEQ node and a sensing complementary bit line SBLB node, and pre-charges the electrically connected bit line BL and complementary bit line BLB with the pre-charging voltage, when a first equalizing signal PEQ is applied to a gate. According to some example embodiments, the first equalizing transistor MP13 may be the P-type transistor, and the second equalizing transistor MN13 may be the N-type transistor.

According to some example embodiments, the local bit line sense amplifier 150 further includes charge transfer transistors MCT and MCTB. A first charge transfer transistor MCT makes or interrupts a connection between the bit line BL and the sensing bit line SBL according to the charge transfer signal CT. A second charge transfer transistor MCTB makes or interrupts a connection between the complementary bit line BLB and the sensing complementary bit line SBLB according to the charge transfer signal CT. According to some example embodiments, the charge transfer transistor may be implemented as the N-type transistor as illustrated in the drawings, but the present invention is not limited thereto and the charge transfer transistor may be implemented as the P-type transistor according to various example embodiments.

According to some example embodiments, the gate of the charge transfer transistors MCT and MCTB is connected to the node N1 in FIG. 4, and thus the charge transfer signal CT may be applied to the gate. The offset transistor MN2 may make or interrupt a connection between the node N2 and the node N1 according to the offset removal signal OC.

Figure 6:
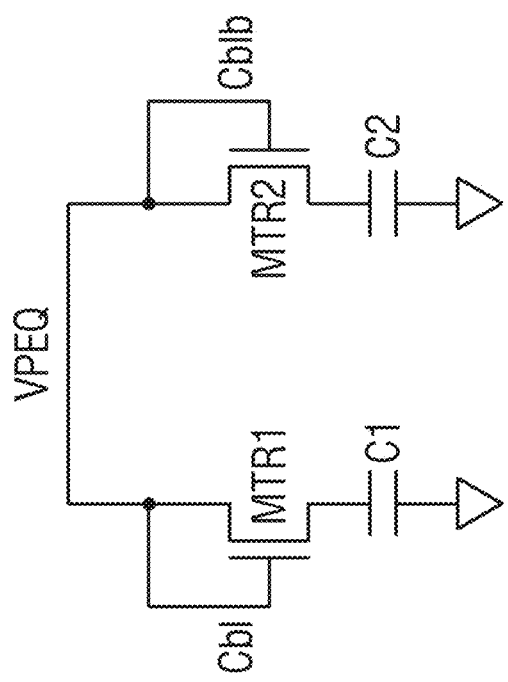
FIG. 6 is an equivalent circuit diagram of the bit line sense amplifier according to some example embodiments.
Figure 7:
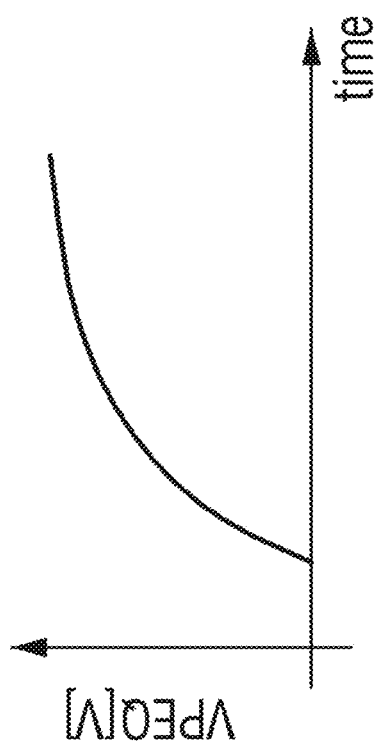
FIG. 7 is a graph illustrating an equalizing voltage of the bit line sense amplifier according to some example embodiments.
Figure 8:
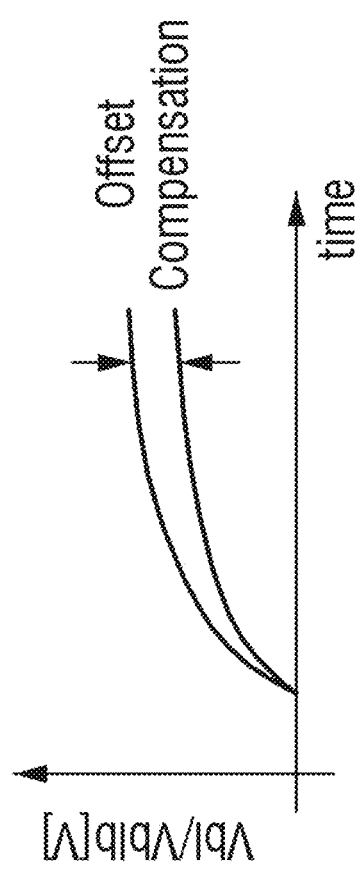
FIG. 8 is a graph illustrating a bit line voltage of the bit line sense amplifier according to some example embodiments.

FIG. 6 is an equivalent circuit diagram of the bit line sense amplifier according to some example embodiments, and FIG. 7 is a graph illustrating an equalizing voltage of the bit line sense amplifier according to some example embodiments. FIG. 8 is a graph illustrating a bit line voltage of the bit line sense amplifier according to some example embodiments.

Referring to FIGS. 4 and 6, when enabling the offset removal signal OC, that is, during an offset removal operation, the offset transistor MN13 electrically connects the node N1 and the node N2. The gate of the charge transistor MCT and MCTB may be connected to the node N1, and the node N2 may be connected to the node N1 according to the offset removal signal OC according to various example embodiments as described above, or the node N2 may receive the internal power voltage Vinta2 or receive the pre-charging voltage VBL.

When the node N1 and the node N2 are electrically connected to each other, the gate of the cell transistor (e.g., MTR1) is connected to a drain terminal of the cell transistor MTR1 to receive the pre-charging voltage (supplying VBL to the VPEQ node). A charge stored in a capacitor C1 of the memory cell is shared with the VPEQ node (N2 in FIG. 4) due to a gate-drain connection of the cell transistor MTR1. Another memory cell MTR2 connected to the same VPEQ node (N2 in FIG. 4) is also shared with a drain of the cell transistor MTR2 stored in the capacitor C2 in the same manner According to the equivalent circuit, a voltage of the VPEQ node (N2 of FIG. 4) increases over time as illustrated in FIG. 7, and a voltage Vb1 of the bit line BL or a voltage Vblb of the complementary bit line BL is represented as a threshold voltage VTH offset as illustrated in FIG. 8.

Figure 9:
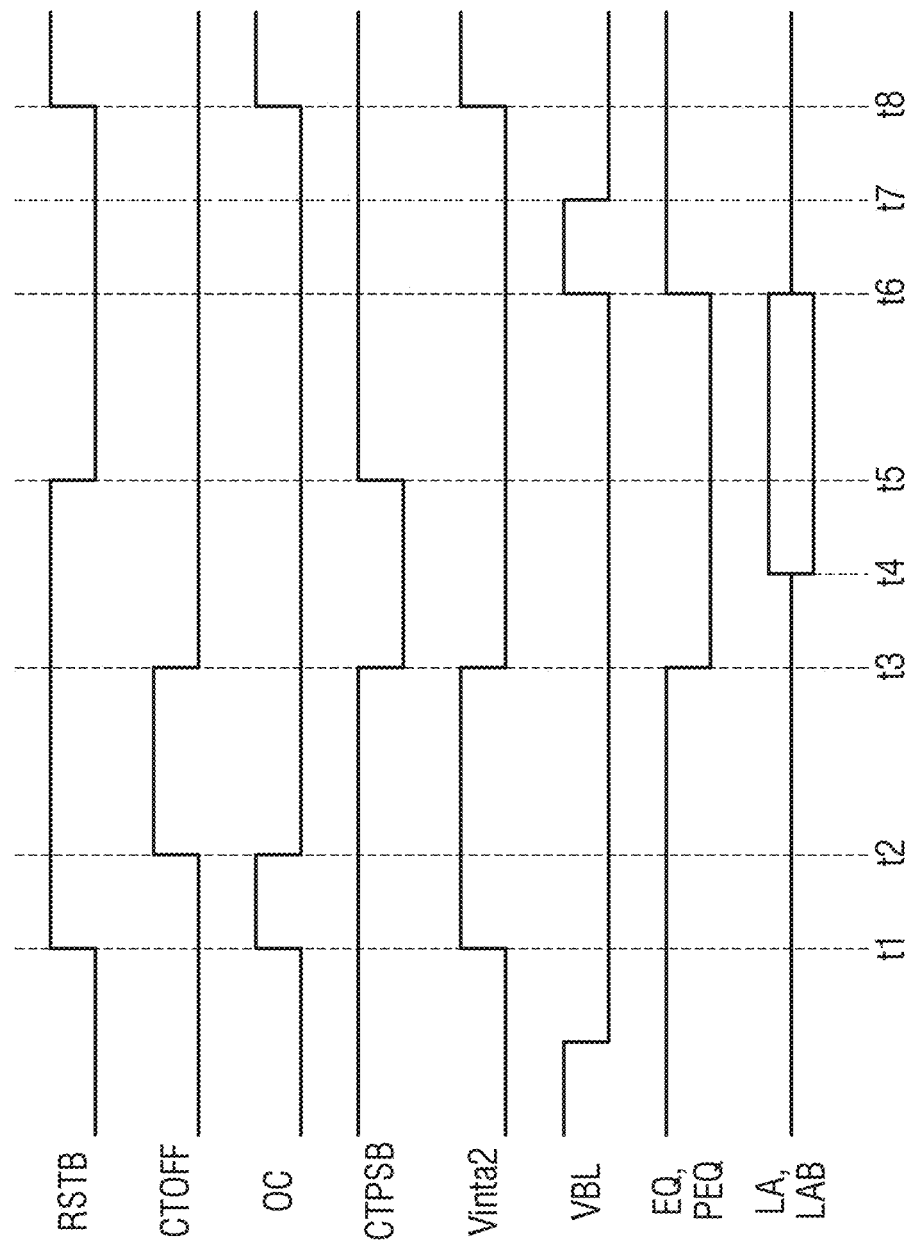
FIG. 9 is a timing diagram illustrating an operation of the bit line sense amplifier according to some example embodiments.
Figure 10:
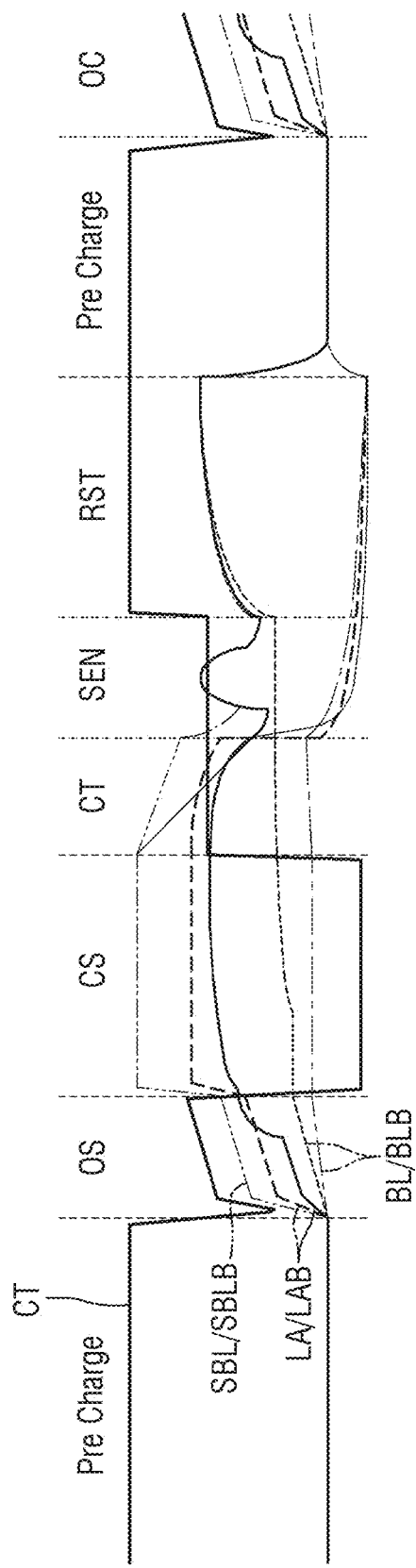
FIG. 10 is a timing diagram illustrating an operation of the bit line sense amplifier according to some example embodiments.

FIG. 9 is a timing diagram illustrating an operation of the bit line sense amplifier according to some example embodiments. FIG. 10 is a timing diagram illustrating an operation of the bit line sense amplifier according to some example embodiments. An X-axis indicates time and a Y-axis indicates a signal level in FIGS. 9 and 10.

The bit line sense amplifier 150 sequentially performs a pre-charging operation, the offset removal operation, the charge sharing operation, a charge transfer operation, a sensing operation, and a restoring operation. In the illustrated example, it is assumed that the memory cell stores data "1".

Referring to FIGS. 4, 5, 9, and 10, the bit line sense amplifier 300 first performs the pre-charge operation in a first section (pre-charge section, section 0-t1). An equalizing signal EQ is applied to a gate of a logic high pre-charge transistor MN4, and the pre-charge transistor MN4 is turned on to supply a pre-charging voltage VBL via the node N2. The pre-charging voltage VBL of the node N2 pre-charges the bit line BL and the complementary bit line BLB. In this case, the restore bar signal RSTB is logic low, and the isolation transistor MP2 that has a P type, is turned on to supply a voltage corresponding to the isolation voltage to the node N2.

As illustrated in FIG. 10, the charge transfer signal CT connected to the node N2 becomes logic high to turn on the charge transfer transistor MCT, and when a CTPSB signal is logic high and a CTOFF signal is logic low, the transfer gate transistors MP1 and MN1 are turned off, respectively. Meanwhile, the offset removal signal OC is logic low to turn off the offset transistor MN2, and thus, the node N1 and the node N2 are not connected to each other. Accordingly, the sensing bit line SBL, and the sensing complementary bit line SBLB, and the bit line BL and the complementary bit line BLB are uniformly pre-charged with the pre-charging voltage VBL.

Upon reviewing a second section (offset removal section, section t1-t2), the offset removal signal CO becomes logic high to turn on the offset transistor MN2, and the restore bar signal RSTB becomes logic high to turn off the isolation transistor MP2. Each of the transfer gate transistors MP1 and MN1 are kept turned off when the CTPSB signal is logic high and the CTOFF signal is logic low, respectively. An internal power enable signal Vinta2 becomes logic high to turn on the internal power supply transistor MN3. The first equalizing signal EQ is logic high to turn on the first pre-charging transistor MN4. The second equalizer signal PEQ is logic high to turn off the second equalizer transistor MP13.

The pre-charging voltage VBL supplied to the node N2 according to the transistor connection in the second section is distributed to the node N1 via the turned-on offset transistor MN2. The node N1 may become lower than the isolation voltage VISO, as may be seen from the voltage level of the charge transfer signal CT. However, the charge transfer transistors MCT and MCTB at both ends of the bit line sense amplifier 150 are turned on, and the internal power supply transistor MN3 and the pre-charge transistor MN4 are turned on, thus supplying the internal power voltage Vinta2 as well as the pre-charging voltage VBL to the node N2. In other words, even if there is a threshold voltage difference VTH_MCT and VTH_MCTB between the charge transfer transistors MCT and MCTB, even the internal power voltage Vinta2 may be supplied to the charge transfer signal by the offset transistor MN2, thus reducing an influence of the threshold voltage offset.

Since the charge transfer transistors MCT and MCTB are turned on, the sensing bit line and the sensing complementary bit line SBL/SBLB output the stored charge to the bit line and the complementary bit line BL/BLB. However, since a control signal LA/LAB is at a desired (or alternatively, predetermined) intermediate level voltage, P-type amplifiers MP11 and MP12 and N-type amplifiers NN11 and NN12 fail to perform amplification.

In a third section (charge sharing section, section t2-t3), when the CTOFF signal becomes logic high, the transfer gate transistor MN1 is turned off. The CTPSB signal is logic high, the transfer gate transistor MP1 is turned off, and the isolation transistor MP2 is turned off, and the offset transistor MN2 is also turned off. However, the internal power supply transistor MN2 and the pre-charging transistor MN4 are kept turned on from the second section. According to such connection, in the third section, the internal power voltage Vinta2 and the pre-charging voltage VBL supplied to the node N2 are added together to generate an equalizing voltage VPEQ and stored in the node N2. The node N1, namely, CT, becomes lower than the voltage level in the second section by the turned-on transfer gate transistor MN1.

When the charge transfer signal CT is logic low by lowering the voltage level of the node N1, the charge transfer transistors MCT and MCTB are turned off, and the transistor MN13 is turned on by the logic high equalizing signal EQ to generate the charge sharing operation between a charge stored in a cell capacitor of the memory cell and a charge stored in the sensing bit line SBL or the sensing complementary bit line BLB. For example, when data "1" is stored in the memory cell, the sensing bit line SBL increases by a desired (or alternatively, predetermined) level due to the charge sharing operation, and when data "0" is stored in the memory cell, the sensing bit line SBL decreases by a desired (or alternatively, predetermined) level due to the charge sharing operation. In this case, since the charge transfer transistors MCT and MCTB are turned off in the bit line and the complementary bit line BLB, their logic states are kept similar to each other in the second section.

In a fourth section (charge transfer section, section t3-t4), when the CTOFF signal becomes logic low and the CTPSB signal becomes logic low, the transfer gate transistor MP1 is turned on, and the transfer gate transistor MN1 is turned off. The equalizing signals EQ and PEQ become logic low to turn off the transistor MN4 and the transistor MN13 in FIG. 5, and to turn on the transistor MP13. In addition, the offset transistor MN2 and the internal power supply transistor MN3 are turned off.

According to the transistor connection of the fourth section, the transfer gate voltage VTG is supplied to the node N1 via the transistor MP1. As the charge transfer signal CT becomes logic high according to the voltage level of the node N1, the charge transfer transistors MCT and MCTB are turned on such that the charge stored in the sensing bit line and the sensing complementary bit line SBL/SBLB are output to the bit line and the complementary bit line BL/BLB via the charge transfer transistors MCT and MCTB. In this case, since the control signals LA and LAB have a desired (or alternatively, predetermined) intermediate level voltage, the P-type amplifiers MP11 and MP12 in FIG. 5 and the N-type amplifiers MN11 and MN12 in FIG. 5 fail to amplify the amount of charge stored in the sensing bit line and the sensing complementary bit line SBL/SBLB, and irrevocably outputs the amount of charge stored in the sensing bit line and the sensing complementary bit line SBL/SBLB, to the bit line and the complementary bit line BL/BLB, after the charge sharing operation.

In a fifth section (sensing section, section t4-t5), the turn-on/turn-off states of the transfer gate transistor MP1, the transfer gate transistor MN1, the equalizing transistors MN4 and the equalizing transistor MN13 in FIG. 5, the offset transistor MN2 and the internal power supply transistor MN3 are kept identical to those in the fourth section. However, as the control signals LA/LAB transition to logic high and logic low, the P-type amplifiers MP11 and MP12 in FIG. 5 and the N-type amplifiers MN11 and MN12 in FIG. 5 are activated to amplify the amount of charge stored in the sensing bit line and the sensing complementary bit line SBL/SBLB, and a voltage according to the amplified amount of charge is output to the bit line and the complementary bit line BL/BLB.

In a sixth section (restore section, section t5-t6), when the CTOFF signal maintains logic low and the CTPSB signal changes from logic low to logic high, the transfer gate transistor MP1 is turned off again, and the transfer gate transistor MN1 is kept turned off. As the restore bar signal RSTB transitions to logic low, the isolation transistor MP2 is turned on. The control signals LA/LAB are maintained like the fourth section, and thus the P-type amplifiers MP11 and MP12 in FIG. 5 and the N-type amplifiers MN11 and MN12 in FIG. 5 perform the amplification. As the isolation voltage VISO is supplied to the node N1, the charge transfer signal CT becomes logic high, and the charge transfer transistors MCT and MCTB are turned on.

The bit line and the complementary bit line BL/BLB may be sensed with the sensing bit line and the sensing complementary bit line SBL/SBLB by the charge transfer transistors MCT and MCTB and may thus be charged or discharged with the amplified charge.

Hereinafter, the pre-charging operation is performed again in the section of t6 to t8 in FIG. 9, and the offset removal operation, the charge sharing operation, the charge transfer operation, the sensing operation, and the restoring operation are sequentially performed again in the section after t8.

Figure 11:
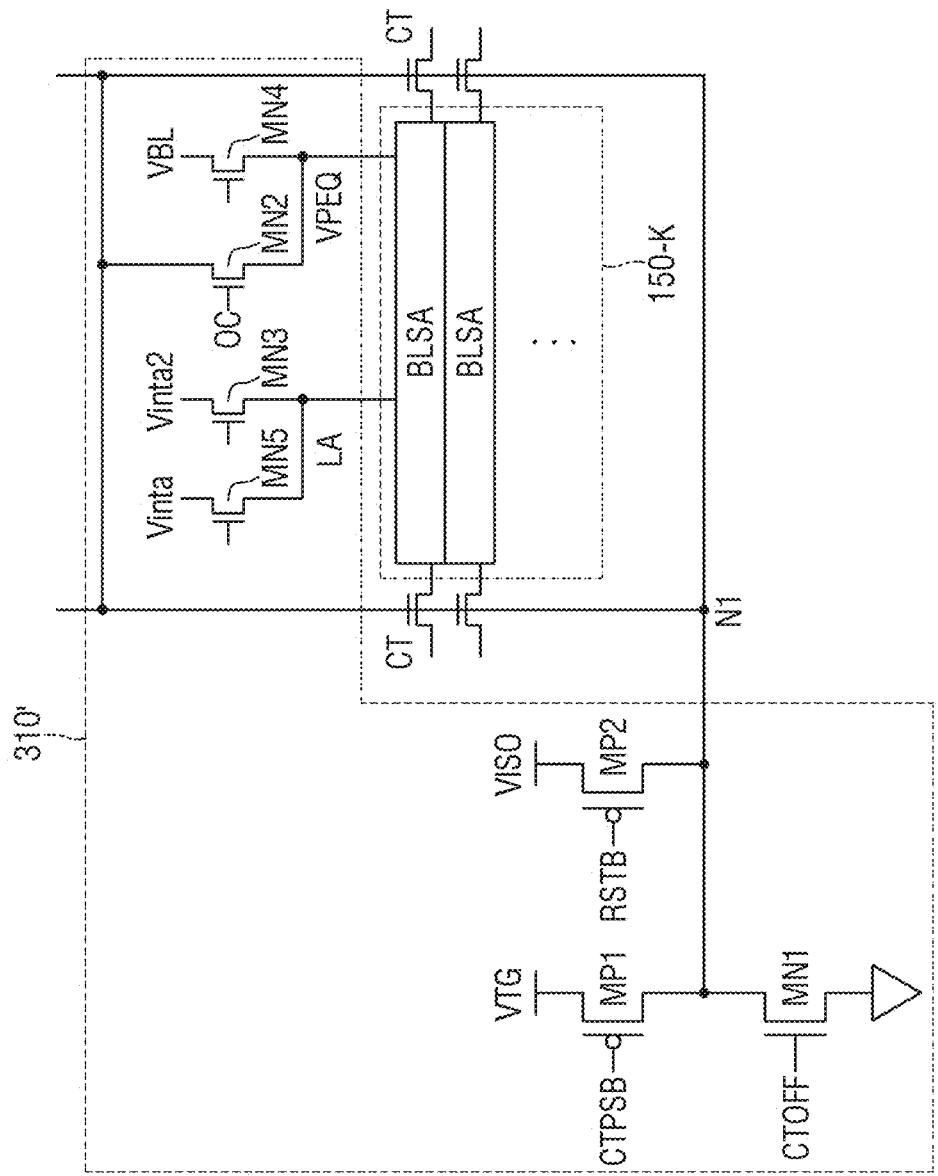
FIG. 11 is a circuit diagram illustrating the bit line sense amplifier according to some example embodiments.

FIG. 11 is a circuit diagram illustrating the bit line sense amplifier according to some example embodiments.

Referring to FIG. 11, according to some example embodiments, the global bit line sense amplifier 300 includes a global connection controller 310' and a plurality of local bit line sense amplifiers 150_k. Each of the local bit line sense amplifiers 150 is connected to the global connection controller 310 via the charge transfer transistor MCT. The charge transfer transistor MCT may be turned on according to the charge transfer signal CT (for example, logic high in the case of the N-type transistor), and the charge transfer signal CT may be logic high or logic low according to the voltage of the node N1.

The global connection controller 310' may include CTPS transistors MP1 and MN1, the isolation transistor MP2, an offset transistor MN2, a first internal power supply transistor MN3, a second internal power supply transistor MNS, and the pre-charging transistor MN4. For convenience of explanation, FIG. 11 illustrates the global connection controller 310 corresponding to any one column of the charge transfer transistor MCT included in the local bit line sense amplifier 150_k, and according to various example embodiments, the global connection controller 310 may be implemented to correspond to each column of the local bit line sense amplifier 150_k.

According to some example embodiments, the transfer gate transistors MP1 and MP2 are connected in series between the transfer gate voltage VTG line and the ground line by using the node N1 to which the charge transfer signal CT is applied, as a common node, and a charge transfer pre-sensing bar signal CTPSB is applied to a gate of a first P-type transistor MP1, and a charge transfer off signal CTOFF is applied to a gate of a first N-type transistor MN1.

The local bit line sense amplifier 150_k is connected to the plurality of bit lines BL and the complementary bit line BLB, respectively, and is connected as a local bit line sense amplifier 150_k. The local bit line sense amplifiers 150_k connect the sensing bit line SBL or the sensing complementary bit line SBL to the bit line BL or the complementary bit line BLB according to the isolation transistor MP2 connected to the memory cell. According to some example embodiments, the isolation transistor MP2 is connected between the isolation voltage line VISO and the node N1, and the restore bar signal RSTB is applied to the gate. The isolation transistor MP2 isolates the bit line BL and the complementary bit line BLB from a sensing bit line SBL and a sensing complementary bit line SBLB according to the restore bar signal RSTB. According to some example embodiments, the isolation transistor MP2 may be implemented as the P-type transistor and is activated and turned on when the restore bar signal RSTB is logic low. According to another example embodiment, when the isolation transistor is implemented as the N-type transistor, the transistor may be activated and turned on when the restoration signal RST is logic high.

According to some example embodiments, the offset transistor MN2 is connected between the VPEQ node and the node N1, and the offset removal signal OC is applied to the gate. According to some example embodiments, a first internal power transistor MN5 is connected between a first internal power voltage Vinta line and a LA node, and a first memory cell enable signal is applied to the gate. According to some example embodiments, the second internal power transistor MN3 is connected between a second internal power voltage Vinta2 line and the LA node, and a second memory cell enable signal is applied to the gate. In accordance with some example embodiments, the pre-charging transistor MN4 is connected between the pre-charging voltage VBL line and a VPEQ node, and the equalizing signal EQ is applied to the gate.

Figure 12:
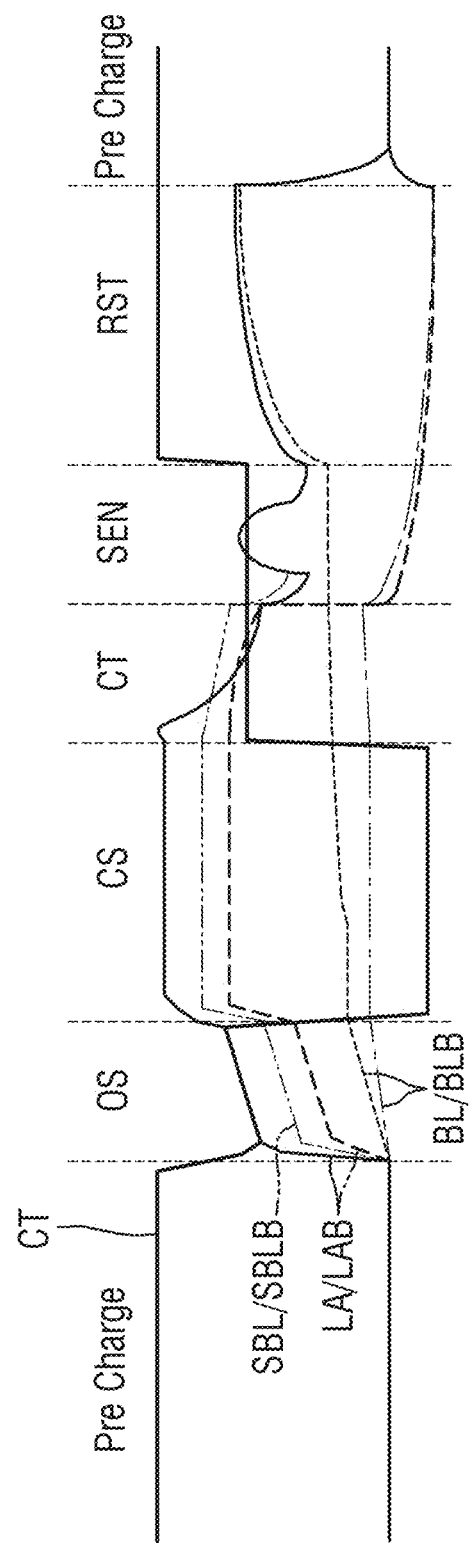
FIG. 12 is a timing diagram illustrating an operation of the bit line sense amplifier according to some example embodiments.

FIG. 12 is a timing diagram illustrating an operation of the bit line sense amplifier according to some example embodiments. The X-axis of FIG. 12 indicates time and the Y-axis indicates a signal level.

The bit line sense amplifier 150 sequentially performs the pre-charging operation, the offset removal operation, the charge sharing operation, the charge transfer operation, the sensing operation, and the restoring operation. In the illustrated example, it is assumed that the memory cell has stored data "1". The difference from FIG. 10 will be mainly described, and redundant descriptions will be omitted herein.

Referring to the graphs of FIGS. 9 and 12 based on the bit line sense amplifier of FIGS. 5 and 11, the bit line sense amplifier 300' first performs the pre-charging operation in the first section (pre-charge section, section 041). In the first section, the offset removal signal OC is logic low to turn off the offset transistor MN2, and thus, the node N1 and the VPEQ node are not connected to each other. Accordingly, the sensing bit line SBL and the sensing complementary bit line SBLB, and the bit line BL and the complementary bit line BLB are uniformly pre-charged with the pre-charging voltage VBL.

Upon reviewing the second section (offset removal section, section t1-t2), the offset removal signal OC becomes logic high to turn on the offset transistor MN2, and the isolation transistor MP2 is turned off according to the restore bar signal RSTB. Each of the transfer gate transistors MP1 and MN1 is kept turned off. The internal power enable signal Vinta2 becomes logic high to turn on a first internal power supply transistor MN5 and a second internal power supply transistor MN3, and the first equalizing signal EQ becomes logic high to turn on the first pre-charging transistor MN4. The second equalizer signal PEQ becomes logic high to turn off the second equalizer transistor MP13.

The voltage of the VPEQ node connected via the offset transistor MN2 is distributed to the node N1. The node N1 is lower than the voltage level in the first section, as seen in the voltage level of the charge transfer signal CT. However, since the voltage level of the node N1 is not logic low, the charge transistors MCT and MCTB at both ends of the bit line sense amplifier 150 are turned on, and the first internal power supply transistor MN5 and the second internal power supply transistor MN3 are turned on to supply the first internal power voltage Vinta and the internal power voltage Vint to the LA node. Then, the pre-charging transistor MN4 is turned on to supply the pre-charging voltage VBL to the VPEQ node. The voltage of the LA node is increased by the first and second internal power voltages, and the sensing bit line and the sensing complementary bit line SBL/SBLB receive the voltage of the VPEQ node supplied via the equalizing transistor MP13, thus gradually increasing the voltage level.

Since the charge transfer transistors MCT and MCTB are turned on, the sensing bit line and the sensing bit complementary line SBL/SBLB output the stored charge to the bit line and complementary bit line BL/BLB, but since the control signals LA/LAB are at the same voltage level, the P-type amplifiers MP11 and MP12 and the N-type amplifiers NN11 and NN12 fail to perform the amplification.

In the third section (charge sharing section, section t2-t3), the transfer gate transistor MN1 is turned on, the transfer gate transistor MP1 is turned off, and the isolation transistor MP2 and the offset transistor MN2 are turned off. However, the first and second internal power supply transistors MN3 and MN5 and the pre-charging transistor MN4 are kept turned off from the second section. In the third section according to such connection, in the VPEQ node, the pre-charging voltage VBL is supplied to the bit line sense amplifier 150 as the equalizing voltage VPEQ. The node N1, namely, CT, is lower than the voltage level of the second section by the turned-on transfer gate transistor MN1. Since the charge transfer transistors MCT and MCTB are turned off according to the voltage level of the node N1, and the equalizing transistor MN13 is turned on by the equalizing signal EQ that is logic high, the charge sharing operation occurs between the charge stored in the cell capacitor of the memory cell and the charge stored in the sensing bit line SBL or the sensing complementary bit line BLB. For example, when data "1" is stored in the memory cell, the sensing bit line SBL increases by the predetermined (or alternatively, desired) level due to the charge sharing operation. Since the charge transfer transistors MCT and MCTB are turned off in the bit line and the complementary bit line BLB, their logic states are kept similar to each other in the second section.

In the fourth section (charge transfer section, section t3-t4), the transfer gate transistor MP1 is turned on and the transfer gate transistor MN1 is turned off. The equalizing signals EQ and PEQ become logic low to turn off the transistors MN4 and MN13 in FIG. 5 and turn on the equalizing transistor MP13. In addition, the offset transistor MN2 and the internal power supply transistor MN3 are turned off.

According to the transistor connection of the fourth section, a transfer gate voltage VTG is supplied to the node N1 via the transistor MP1, and the charge transfer signal CT become logic high according to the voltage level of the node N1, thus turning on the charge transistors MCT and MCTB. The charge stored in the sensing bit line and the sensing complementary bit line SBL/SBLB are output to the bit line and the complementary bit line BL/BLB via the charge transfer transistors MCT and MCTB. According to the internal power enable signal Vinta in FIG. 9, the first internal power Vinta or the second internal power Vinta2 is continuously supplied to the LA node. The amount of charge stored in the sensing bit line and the sensing complementary bit line SBL/SBLB is output to the bit line and the complementary bit line BL/BLB after the charge sharing operation.

In the fifth section (sensing section, section t4-t5), the turn-on/turn-off state of the transfer gate transistor MP1, the transfer gate transistor MN1, the equalizing transistor MN4 and the equalizing transistor MN13 in FIG. 5, the offset transistor MN2 and the internal power supply transistor MN3 are kept identical to those in the fourth section. However, as the control signals LA/LAB transitions to logic high and logic low, respectively, the P-type amplifiers MP11 and MP12 in FIG. 5 and the N-type amplifiers MN11 and MN12 in FIG. 5 are activated to amplify the amount of charge stored in the sensing bit line and the sensing complementary bit line SBL/SBLB, and the voltage according to the amplified amount of charge is output to the bit line and the complementary bit line BL/BLB.

In a sixth section (restore section, section t5-t6), when the CTOFF signal maintains logic low and the CTPSB signal changes from logic low to logic high, the transfer gate transistor MP1 is turned off again, and the transfer gate transistor MN1 is kept turned off. As the restore bar signal RSTB transitions to logic low, the isolation transistor MP2 is turned on. The control signals LA/LAB are maintained like the fourth section, and thus the P-type amplifiers MP11 and MP12 in FIG. 5 and the N-type amplifiers MN11 and MN12 in FIG. 5 perform the amplification. As the isolation voltage VISO is supplied to the node N1, the charge transfer signal CT becomes logic high, and the charge transfer transistors MCT and MCTB are turned on.

The bit line and the complementary bit line BL/BLB may be sensed with the sensing bit line and the sensing complementary bit line SBL/SBLB by the charge transfer transistors MCT and MCTB and may thus be charged with the amplified charge or discharged.

Hereinafter, the pre-charging operation is performed again in the section of t6 to t8 in FIG. 9, and the offset removal operation, the charge sharing operation, the charge transfer operation, the sensing operation, and the restoring operation are sequentially performed again in the section after t8.

Figure 13:
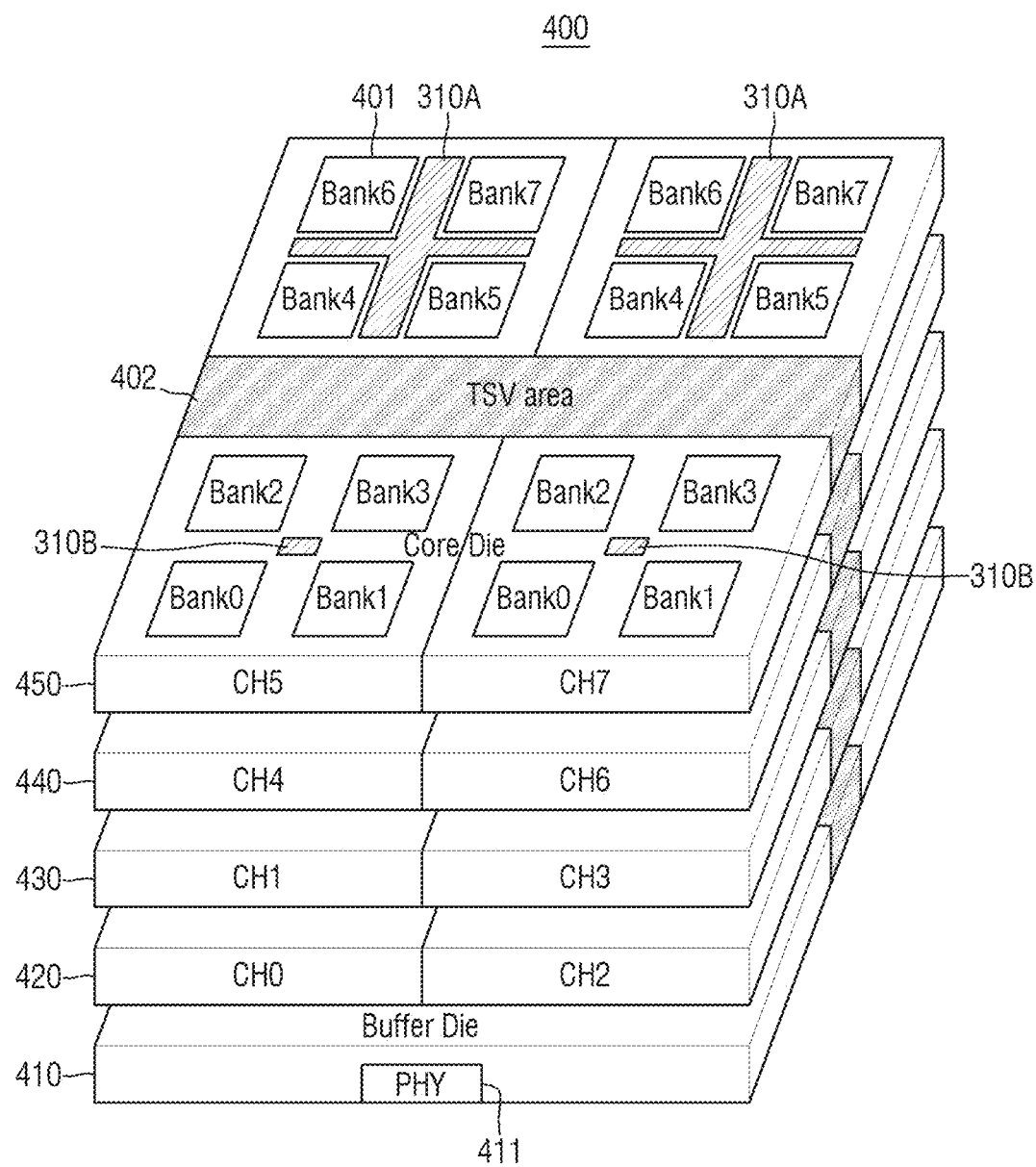
FIG. 13 is a block diagram illustrating a stacked memory device according to some example embodiments.

FIG. 13 is a block diagram illustrating a stacked memory device according to some example embodiments.

Referring to FIG. 13, the stacked memory device 400 may include a buffer die 410 and a plurality of core dies 420 to 450. For example, the buffer die 410 may be referred to as an interface die, a base die, a logic die or a master die, and each of the core dies 420 to 450 may be referred to as a memory die or a slave die. Even though FIG. 13 illustrates that four core dies 420 to 450 are included in the stacked memory device 400, the number of core dies may be variously changed. For example, the stacked memory device 400 may include eight core dies, 12 core dies, or 16 core dies.

The buffer die 410 and the core die 420 to 450 may be stacked via silicon penetration electrodes (TSV) and connected electrically to each other. Accordingly, the stacked memory device 400 may have a 3D memory structure in which a plurality of dies 410 to 450 are stacked. For example, the stacked memory device 400 may be implemented based on an HBM or an HMC standard.

The stacked memory device 400 may support a plurality of functionally independent channels (or vaults). For example, the stacked memory device 400 may support eight channels CH0 to CH7. When each of the channels CH0 to CH7 supports 128 data DQ transfer paths I/O, the stacked memory device 400 may support 1024 data transfer paths. However, the present disclosure is not limited thereto, and the stacked memory device 400 may support 1024 or more data transfer paths and may support eight or more channels (for example, 16 channels). When the stacked memory device 400 supports 16 channels, each of the channels may support 64 data transfer paths.

Each of the core dies 420 to 450 may support at least one channel. For example, as illustrated in FIG. 13, each of the core dies 420 to 450 may support two channels (CH0-CH2, CH1-CH3, CH4-CH6, and CH5-CH7). In this case, the core dies 420 to 450 may support different channels. However, the present disclosure is not limited thereto, and at least two of the core dies 420 to 450 may support the same channel. For example, each of the core dies 420 to 450 may support a first channel CH0.

Each of the channels may constitute an independent command and a data interface. For example, each channel may be independently clocked based on an independent timing requirement and may not be synchronized with each other. For example, each channel may change a power state or perform a refreshing operation based on the independent command.

Each of the channels may include a plurality of memory banks 401. Each of the memory banks 401 may include the memory cells connected to the word lines and the bit lines, a row decoder, a column decoder, and a sense amplifier. For example, each of the channels CH0 to CH7 may include eight memory banks 401. However, the present disclosure is not limited thereto, and each of the channels CH0 to CH7 may include eight or more memory banks 401. Even though FIG. 13 illustrates that the memory banks included in one channel are included in one core die, the memory banks included in the one channel may be distributed in a plurality of core dies. For example, when each of the core dies 420 to 450 supports the first channel CH0, the memory banks included in the first channel CH0 may be distributed in the core dies 420 to 450.

In some example embodiments, one channel may be divided into two pseudo-channels that operate independently. For example, the pseudo-channels may share commands and clock inputs (e.g., clock signal CK and clock enable signal CK) of a channel but may independently decode and execute the commands. For example, when one channel supports 128 data transfer paths, each of the pseudo-channels may support 64 data transfer paths. For example, when one channel supports 64 data transfer paths, each of the pseudo-channels may support 32 data transfer paths.

The buffer die 410 and the core dies 420 to 450 may include a TSV region 402. TSVs configured to penetrate the dies 410 to 450 may be disposed in the TSV region 402. The buffer die 410 may transmit or receive signals and/or data to or from the core dies 420 to 450 through the TSVs. Each of the core dies 420 to 450 may transmit or receive signals and/or data to or from the buffer die 410 and other core dies through the TSVs. In this case, the signals and/or data may be independently transmitted and received through the TSVs corresponding to each channel. For example, when an external host device transmits a command and an address to the first channel CH0 to access the memory cell of the first core die 420, the buffer die 410 may transmit control signals to the first core die 420 via the TSVs corresponding to the first channel CH0 and access the memory cell of the first channel CH0.

The buffer die 410 and the core dies 420 to 450 may further include a control logic. The control logic may control access to the memory banks 401 based on the command and the address signal supplied from the memory controller (FIG. 1) and may generate control signals for accessing the memory banks 401.

The buffer die 410 and the core die 420 to 450 may include global connection controllers 310 and 310' according to some example embodiments of FIG. 4 or 11. The global connection controllers 310 and 310' may be disposed in a peripheral circuit region of a first semiconductor layer 410 according to some example embodiments or may be disposed in a junction region of the first semiconductor layer 410 according to other example embodiments. For example, the internal power supply transistor MN3 and/or MN5 may be disposed in a junction region in which the bit line sense amplifier is not disposed, according to some example embodiments.

The buffer die 410 may include a physical layer PHY 411. The physical layer 411 may include interface circuits for communication with the external host device. For example, the physical layer 411 may include interface circuits corresponding to the memory device interface described in FIG. 1. The signals and/or data received via the physical layer 411 may be transmitted to the core dies 420 to 450 via the TSVs.

In some example embodiments, the buffer die 410 may include a channel controller corresponding to each of the channels. The channel controller may manage memory reference operations of a corresponding channel, and may determine timing requirements of the corresponding channel.

In some example embodiments, the buffer die 410 may include a plurality of pins for receiving signals from the external host device. The buffer die 410 may receive a clock signal CK, a command/address signal C/A, a write data strobe signal WDQS, and a data signal DQ via the plurality of pins, and may transmit a read data strobe signal RDQS and a data signal DQ. For example, the buffer die 410 may include two pins for receiving the clock signal CK per channel, 14 pins for receiving the command/address signal C/A, eight pins for receiving the write data strobe signal WDQS, eight pins for transmitting the read data strobe signal RDQS, and 128 pins for transmitting or receiving the data signal DQ.

Figure 14:
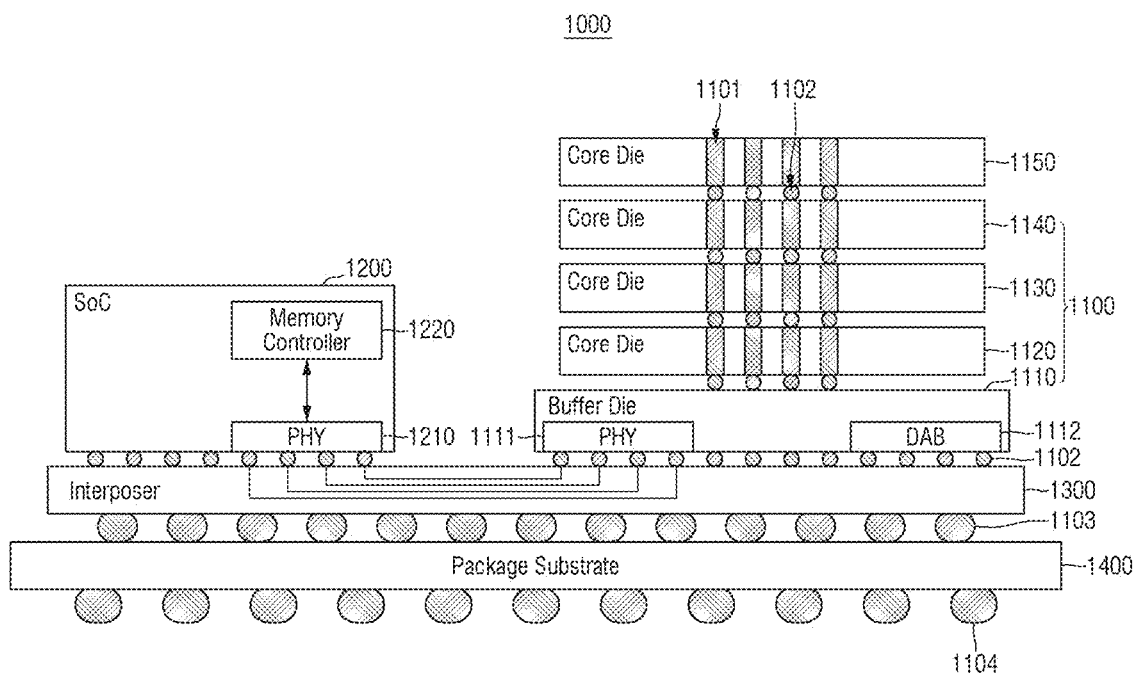
FIG. 14 is a diagram illustrating a semiconductor package according to some example embodiments.

FIG. 14 is a diagram illustrating a semiconductor package according to some example embodiments.

Referring to FIG. 14, the semiconductor package 1000 may include a stacked memory device 1100, a system-on-chip 1200, an interposer 1300, and a package substrate 1400. The stacked memory device 1100 may include a buffer die 1110 and core dies 1120 to 1150. The buffer die 1110 may correspond to the buffer die 410 in FIG. 13, and each of the core dies 1120 to 1150 may correspond to each of the core dies 420 to 450 in FIG. 13.

Each of the core dies 1120 to 1150 may include a memory cell array. The buffer die 1110 may include physical layers PHY 1111, and direct access region DAB 1112. The physical layer 1111 may be electrically connected to a physical layer 1210 of the system-on-chip 1200 via the interposer 1300. The stacked memory device 1100 may receive signals from the system-on-chip 1200 via the physical layer 1111 or may transmit signals to the system-on-chip 1200. The physical layer 1111 may include interface circuits of the buffer die 410 described with reference to FIG. 13.

The direct access region 1112 may supply an access path capable of testing the stacked memory device 1100 without passing through the system-on-chip 1200. The direct access region 1112 may include a conductive means (e.g., a port or a pin) capable of directly communicating with the external test device. The test signal and data received via the direct access region 1112 may be transmitted to the core dies 1120 to 1150 via the TSVs. Data read from the core dies 1120 to 1150 for testing of the core dies 1120 to 1150 may be transmitted to the test device via the TSVs and the direct access region 1112. Accordingly, a direct access test may be performed for the core dies 1120 to 1150.

The buffer die 1110 and the core dies 1120 to 1150 may be electrically connected to each other via TSVs 1101 and bumps 1102. The buffer die 1110 may receive signals supplied to each channel from the system-on-chip 1200 via bumps 1102 allocated for each channel. For example, the bumps 1102 may be micro bumps.

The system-on-chip 1200 may execute applications supported by the semiconductor package 1000 using the stacked memory device 1100. For example, the system-on-chip 1200 may operate specialized arithmetic operations by including at least one of the processors, including a central processing unit (CPU), an application processor (AP), a graphical processing unit (GPU), a natural processing unit (NPU), a vision processing unit (VPU), an image processor (ISP), and a digital processor (DSP).

The system-on-chip 1200 may include the physical layer 1210 and a memory controller 1220. The physical layer 1210 may include input/output circuits for transmitting or receiving signals to or from the physical layer 1111 of the stacked memory device 1100. The system-on-chip 1200 may supply various signals to the physical layer 1111 via the physical layer 1210. The signals supplied to the physical layer 1111 may be transmitted to the core dies 1120 to 1150 via interface circuits and the TSVs 1101 of the physical layer 1111.

The memory controller 1220 may control an overall operation of the stacked memory device 1100. The memory controller 1220 may transmit signals for controlling the stacked memory device 1100 to the stacked memory device 1100 via the physical layer 1210.

The interposer 1300 may connect the stacked memory device 1100 and the system-on-chip 1200. The interposer 1300 may make a connection between the physical layer 1111 of the stacked memory device 1100 and the physical layer 1210 of the system-on-chip 1200, and may supply physical paths formed using conductive materials. Accordingly, the stacked memory device 1100 and the system-on-chip 1200 may be stacked on the interposer 1300 so that they transmit or receive signals to or from each other.

Bumps 1103 may be attached to an upper portion of the package substrate 1400, and solder balls 1104 may be attached to a lower portion thereof. For example, the bumps 1103 may be flip-chip bumps. The interposer 1300 may be stacked on the package substrate 1400 via the bumps 1103. The semiconductor package 1000 may transmit or receive the signals to or from other external packages or semiconductor devices via the solder balls 1104. For example, the package substrate 1400 may be a printed circuit board (PCB).

Figure 15:
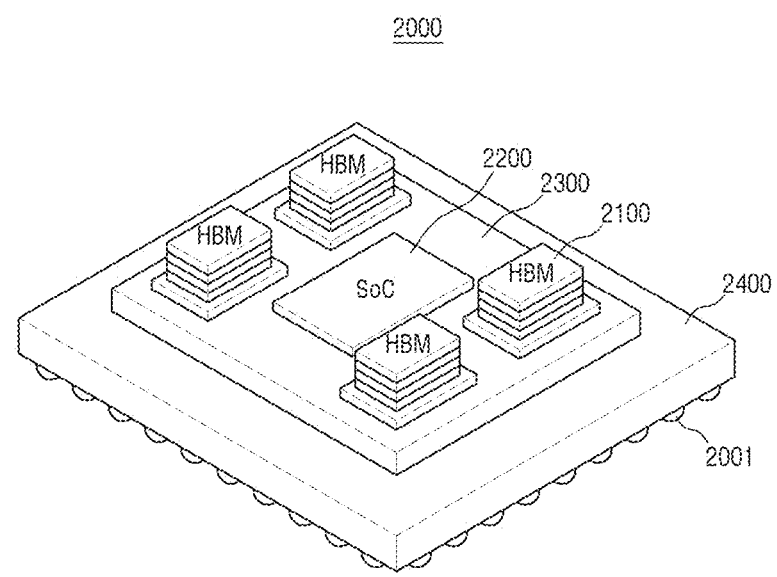
FIG. 15 is a diagram illustrating an implemented example of a semiconductor package according to some example embodiments of the present disclosure.

FIG. 15 is a diagram illustrating an implemented example of a semiconductor package according to some example embodiments of the present disclosure.

Referring to FIG. 15, the semiconductor package 2000 may include a plurality of stacked memory devices 2100 and a system-on-chip 2200. The stacked memory devices 2100 and the system-on-chip 2200 may be stacked on an interposer 2300, and the interposer 2300 may be stacked on a package substrate 8400. A semiconductor package 800 may transmit or receive signals to or from other external packages or semiconductor devices via solder balls 2001 attached to a lower portion of the package substrate 8400.

Each of the stacked memory devices 2100 may be implemented based on an HBM standard. However, the present disclosure is not limited thereto, and each of the stacked memory devices 2100 may be implemented based on GDDR, HMC, or a Wide I/O standard. Each of the stacked memory devices 2100 may correspond to the stacked memory device 1000 of FIG. 14.

The system-on-chip 2200 may include at least one processor such as a CPU, an AP and an NPU, and a plurality of memory controllers for controlling the plurality of stacked memory devices 2100. The system-on-chip 2200 may transmit or receive the signals to or from a corresponding stacked memory device via the memory controller. The system-on-chip 2200 may correspond to the system-on-chip 1200 in FIG. 14.

Figure 16:
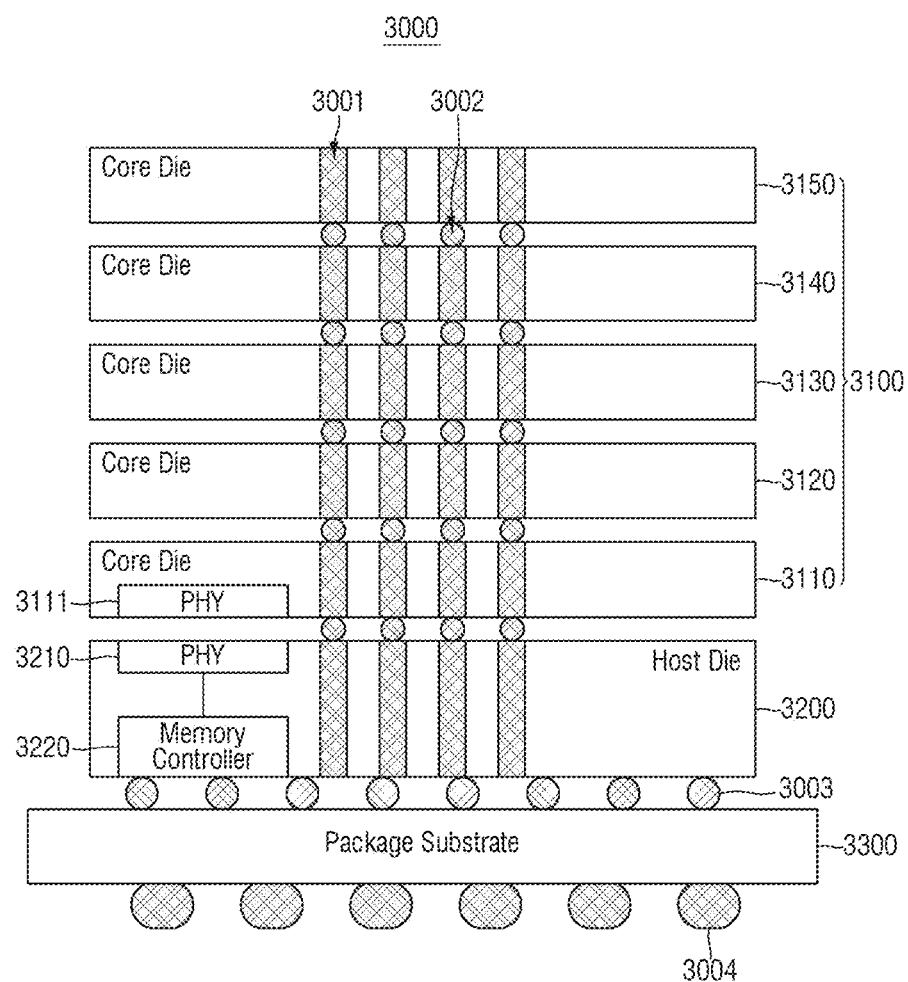
FIG. 16 is a diagram illustrating the semiconductor package according to some example embodiments.

FIG. 16 is a diagram illustrating the semiconductor package according to some example embodiments.

Referring to FIG. 16, the semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for communicating with the host die 3200, and each of the core dies 3120 to 3150 may include a memory cell array. The stacked memory device 3100 may correspond to the stacked memory device 400 in FIG. 13.

The host die 3200 may include a physical layer 3210 for communicating with the stacked memory device 3100 and a memory controller 3220 for controlling an overall operation of the stacked memory device 3100. In addition, the host die 3200 may include a processor for controlling the overall operation of the semiconductor package 3000 and executing an application supported by the semiconductor package 3000. For example, the host die 3200 may include at least one processor such as a CPU, an AP and an NPU.

The stacked memory device 3100 may be disposed on the host die 3200 based on TSVs 3001 and may be vertically stacked on the host die 3200. Accordingly, the buffer die 3110, the core dies 3120 to 3150, and the host die 3200 may be electrically connected to each other via the TSVs 3001 and bumps 3002 without the interposer. For example, the bumps 3002 may be micro bumps.

Bumps 3003 may be attached to an upper portion of the package substrate 3300, and solder balls 3004 may be attached to a lower portion thereof. For example, the bumps 3003 may be flip-chip bumps. The host die 3200 may be stacked on the package substrate 3300 via the bumps 3003. The semiconductor package 3000 may transmit or receive signals to or from other external packages or semiconductor devices via the solder ball 3004.

In another example embodiment, the stacked memory device 3100 may be implemented only with the core dies 3120 to 3150 without the buffer die 3110. In this case, each of the core dies 3120 to 3250 may include interface circuits for communicating with the host die 3200. Each of the core dies 3120 to 3250 may transmit or receive signals to or from the host die 3200 via the TSVs 3001.

Although the example embodiments of the present disclosure have been described above with reference to the accompanying drawings, the present disclosure may be embodied in many different forms without changing technical subject matters and essential features as will be understood by those skilled in the art. Therefore, example embodiments set forth herein are examples only and not to be construed as a limitation.

What is claimed is:

1. A memory device comprising:
   a memory cell array connected to a first bit line and a complementary bit line;
   a first bit line sense amplifier configured to sense, amplify and output a first bit line signal and a complementary bit line signal, the first bit line signal output on the first bit line and the complimentary bit line signal output on the complementary bit line;
   a charge transfer transistor connected to the first bit line sense amplifier and configured to be gated by a charge transfer signal of a first node;
   an offset transistor configured to connect the first node and a second node based on an offset removal signal; and
   a pre-charging transistor connected between the second node and a pre-charging voltage line, and the pre-charging transistor configured to pre-charge the first bit line or the complementary bit line based on an equalizing signal.

2. The memory device of claim 1, further comprising:
   an isolation transistor connected between an isolation voltage line and the first node, and the isolation transistor configured to isolate (i) the first bit line from a sensing bit line of the first bit line sense amplifier and (ii) the complementary bit line from a sensing complementary bit line of the first bit line sense amplifier based on a restore bar signal.

3. The memory device of claim 1, wherein the second node configured to receive an internal power voltage during an offset removal operation of the offset transistor.

4. The memory device of claim 1, further comprising:
   an internal power supply transistor connected between the second node and an internal power supply line, and the internal power supply configured to supply an internal power voltage to the second node based on an internal power enable signal.

5. The memory device of claim 1, further comprising:
   a first transfer gate transistor connected between a transfer gate voltage line and the first node, and the first transfer gate transistor configured to supply a transfer gate voltage to the first node based on a charge transfer pre-sensing bar signal.

6. The memory device of claim 5, further comprising
   a second transfer gate transistor connected between the first node and a ground power line, and the second transfer gate transistor configured to supply a ground voltage to the first node based on a charge transfer off signal.

7. A memory device comprising:
   a memory cell array connected to a sensing bit line and a sensing complementary bit line;
   a local bit line sense amplifier configured to output a first signal output on the sensing bit line to a first bit line and output a complementary signal output on the sensing complementary bit line to a complementary bit line;
   a first charge transfer transistor connected between the sensing bit line and the first bit line and the first charge transfer transistor configured to be turned on or off based on a charge transfer signal of a first node; and
   a second charge transfer transistor connected between the sensing complementary bit line and the complementary bit line and the second charge transfer transistor configured to be turned on or off based on the charge transfer signal, wherein the local bit line sense amplifier includes a first equalizing transistor which is connected between a second node and the sensing complementary bit line and gated by a signal of the second node; and the local bit line sense amplifier is configured such that a pre-charging voltage is supplied to the second node during an offset removal operation and such that the first node is connected to the second node during the offset removal operation.

8. The memory device of claim 7, further comprising:
a first transfer gate transistor which is connected between a transfer gate voltage line and the first node, and the first transfer gate transistor being configured to supply a transfer gate voltage to the first node based on a charge transfer pre-sensing bar signal.

9. The memory device of claim 8, further comprising:
a second transfer gate transistor which is connected between the first node and a ground power line, and the second transfer gate transistor being configured to supply a ground voltage to the first node based on a charge transfer off signal.

10. The memory device of claim 9, further comprising:
an isolation transistor which is connected between an isolation voltage line and the first node, and the isolation transistor being configured to isolate (i) the first bit line from the sensing bit line and (ii) the complementary bit line from the sensing complementary bit line based on a restore bar signal.

11. The memory device of claim 7, further comprising:
an offset transistor connected between the first node and the second node, and the offset transistor being configured to connect the first node and the second node based on an offset removal signal; and
a pre-charge transistor connected between a pre-charging voltage line and the second node, and the pre-charge transistor being configured to supply the pre-charging voltage to the second node during the offset removal operation.

12. The memory device of claim 11, further comprising:
an internal power supply transistor connected between a first internal power supply line and the second node, and the internal power supply transistor being configured to supply an internal power voltage to the second node during the offset removal operation.

13. The memory device of claim 11, further comprising:
a first internal power supply transistor connected between a first internal power supply line Vinta2 and a first control line, and the first internal power supply transistor being configured to supply a first internal power voltage to the first control line during the offset removal operation, and
a second internal power supply transistor connected between a second internal power supply line, and the first control line and the second internal power supply transistor being configured to supply a second internal power voltage to the first control line during the offset removal operation.

14. The memory device of claim 13, wherein the local bit line sense amplifier comprises:
P-type amplifiers having one end of the P-type amplifiers connected to the first control line and the other end of the P-type amplifiers connected to the sensing bit line and the sensing complementary bit line; and
N-type amplifiers having one end of the N-type amplifiers connected to a second control line and the other end of the N-type amplifiers connected to the sensing bit line and the sensing complementary bit line,
wherein an amplification transistor of one of the P-type amplifiers and an amplification transistor of one of the N-type amplifiers are cross-coupled to each other.

15. The memory device of claim 14, wherein the local bit line sense amplifier comprises a second equalizing transistor configured to connect the sensing bit line and the sensing complementary bit line based on a second equalizing signal.

16. A memory device comprising:
a memory cell array in a memory bank region of a buffer die and including a plurality of memory cells;
a plurality of local bit line sense amplifiers between the memory bank regions and the plurality of local bit line sense amplifiers being connected between the memory cell and a first bit line or between the memory cell and a complementary bit line;
a global connection controller in a conjunction region of the buffer die and the global connection controller configured to control an operation of the local bit line sense amplifier; and
a charge transfer transistor configured to connect a sensing bit line of the local bit line sense amplifier to the first bit line and a sensing complementary bit line of the local bit line sense amplifier to the complementary bit line, in response to a charge transfer signal supplied via a first node of the global connection controller being applied to a gate of the charge transfer transistor, and
wherein the global connection controller connects the first node and a second node while supplying a pre-charging voltage to the second node, a gate of a first equalizing transistor of the local bit line sense amplifier being connected to the second node during an offset removal operation.

17. The memory device of claim 16, wherein the global connection controller comprises:
an offset transistor connected between the first node and the second node, and the offset transistor being configured to connect the first node and the second node based on an offset removal signal; and
a pre-charge transistor connected between a pre-charging voltage line and the second node, and the pre-charge transistor being configured to supply the pre-charging voltage to the second node during the offset removal operation.

18. The memory device of claim 17, wherein the global connection controller comprises:
an internal power supply transistor connected between a first internal power supply line and the second node and the internal power supply transistor being configured to supply an internal power voltage to the second node during the offset removal operation.

19. The memory device of claim 17, wherein the global connection controller comprises:
a first internal power supply transistor connected between a first internal power supply line Vinta2 and a first control line, and the first internal power supply transistor being configured to supply a first internal power voltage to the first control line during the offset removal operation; and
a second internal power supply transistor connected between a second internal power supply line Vinta and the first control line, and the second internal power supply transistor being configured to supply a second internal power voltage to the first control line during the offset removal operation.

20. The memory device of claim 17, wherein the global connection controller comprises:

a first transfer gate transistor connected between a transfer gate voltage line and the first node, and the first transfer gate transistor being configured to supply a transfer gate voltage to the first node based on a charge transfer pre-sensing bar signal; and a second transfer gate transistor connected between the first node and a ground power line, and the second transfer gate transistor being configured to supply a ground voltage to the first node based on a charge transfer off signal.

\* \* \* \* \*